(12) United States Patent
Lum et al.

(10) Patent No.: US 10,755,844 B2
(45) Date of Patent: Aug. 25, 2020

(54) METHOD OF FABRICATING A SHAPE-CHANGEABLE MAGNETIC MEMBER, METHOD OF PRODUCING A SHAPE CHANGEABLE MAGNETIC MEMBER AND SHAPE CHANGEABLE MAGNETIC MEMBER

(71) Applicant: MAX-PLANCK-GESELLSCHAFT ZUR FÖRDERUNG DER WISSENSCHAFTEN E.V., Munich (DE)

(72) Inventors: Guo Zhan Lum, Stuttgart (DE); Zhou Ye, Cupertino, CA (US); Metin Sitti, Stuttgart (DE)

(73) Assignee: Max-Plank-Gesellschaft-zur-Forderung der Wissenschaften e.V. (DE)

( * ) Notice: Subject to any disclaimer, the term of this patent is extended or adjusted under 35 U.S.C. 154(b) by 405 days.

(21) Appl. No.: 15/596,635

(22) Filed: May 16, 2017

(65) Prior Publication Data

US 2018/0012693 A1 Jan. 11, 2018

(30) Foreign Application Priority Data

Jun. 20, 2016 (EP) .................................. 16175341

(51) Int. Cl.
*H01F 13/00* (2006.01)
*H01L 41/47* (2013.01)
*H01L 41/12* (2006.01)

(52) U.S. Cl.
CPC ............. *H01F 13/00* (2013.01); *H01L 41/12* (2013.01); *H01L 41/47* (2013.01)

(58) Field of Classification Search
CPC .......... H01F 13/00; H01L 41/12; H01L 41/47
See application file for complete search history.

(56) References Cited

U.S. PATENT DOCUMENTS

| 3,638,153 A | 1/1972 | Sparrow |
| 7,901,524 B1 | 3/2011 | Mcknight et al. |
| 2002/0117906 A1 | 8/2002 | Ullakko |
| 2004/0074066 A1* | 4/2004 | Ulicny ............... A44B 18/0003 24/442 |

(Continued)

FOREIGN PATENT DOCUMENTS

| EP | 0997953 A1 * | 5/2000 | ............. H01L 41/12 |
| EP | 0997953 A1 | 5/2000 | |

(Continued)

OTHER PUBLICATIONS

Diller, E. et al. Continuously Distributed Magnetization Profile for Millimeter-Scale Elastomeric Undulatory Swimming. Applied Physics Letters 104, 174101 (2014).

(Continued)

*Primary Examiner* — Daniel McNally
(74) *Attorney, Agent, or Firm* — Dickinson Wright PLLC

(57) ABSTRACT

The present invention relates to a method of fabricating a shape-changeable magnetic member comprising a plurality of segments with each segment being able to be magnetized with a desired magnitude and orientation of magnetization, to a method of producing a shape changeable magnetic member composed of a plurality of segments and to a shape changeable magnetic member.

8 Claims, 8 Drawing Sheets

(56) References Cited

U.S. PATENT DOCUMENTS

| | | | |
|---|---|---|---|
| 2014/0145435 A1 | 5/2014 | Zhu et al. | |
| 2014/0225694 A1* | 8/2014 | Sitti | H01F 13/003 335/295 |

FOREIGN PATENT DOCUMENTS

| | | |
|---|---|---|
| FR | 2098353 A1 | 3/1972 |
| WO | 99/45631 A2 | 10/1999 |

OTHER PUBLICATIONS

Diller, E., Giltinan, J., Lum, G. Z., Ye, Z., Sitti, M. Six-degree-of-freedom magnetic actuation for wireless microrobotics. International Journal of Robotics Research 35, 114-128 (2015).

Diller, E., Sitti, M. Three-dimensional programmable assembly by untethered magnetic robotic micro-grippers. Advanced Functional Materials 24, 4397-4404 (2014).

Diller, E., Zhuang, J., Lum, G. Z., Edwards, M. R., Sitti, M. Continuously distributed magnetization profile for millimeter-scale elastomeric undulatory swimming. Applied Physics Letters 104, 174101 (2014).

Elbuken, C., Khamesee, M., Yavuz, M. Design and implementation of a micromanipulation system using a magnetically levitated MEMS robot. IEEE/ASME Transactions on Mechatronics 14, 434-445 (2009).

Felton, S., Tolley, M., Demaine, E., Rus, D., Wood R. A method for building self-folding machines. Science 345, 644-646 (2014).

Hawkes, E. et al. Programmable matter by folding. Proceedings of the National Academy of Sciences 107, 12441-12445 (2010).

Jeong, K. U. et al. Three-dimensional actuators transformed from the programmed two-dimensional structures via pending, twisting and folding mechanisms. J. Mater. Chem. 21, 6824-6830 (2011).

Khalil, I. S., Magdanz, V. Sanchez, S., Schmidt, O. G., Misra, S. The control of self-propelled microjets inside a microchannel with time-varying flow rates. IEEE Transactions on Robotics 30, 49-58 (2013).

Khamesee, M., Kato, N., Nomura, Y., Nakamura, T. Design and control of a microrobotic system using magnetic levitation. IEEE/ASME Transactions on Mechatronics 7, 1-14 (2002).

Kim, J. et al. Programming magnetic anisotropy in polymeric microactuators. Nature Materials 10, 747-752 (2011).

Kummer, M. et al. OctoMag: An electromagnetic system for 5-DOF wireless micromanipulation. IEEE Transactions on Robotics 26, 1006-1017 (2010).

Liu, Y., Boyles, J. K., Genzer, J., Dickey, M. D. Self-folding of polymer sheets using local light absorption. Soft Matter 8, 1764-1769 (2011).

Maeda, S., Hara, Y., Sakai, T., Yoshida, R., Hashimoto, S. Self-walking gel. Advanced Materials 19, 3480-3484 (2007).

Martinez, R. V., Fish, C. R., Chen, X., Whitesides, G. M. Elastomeric origami: programmable paper-elastomer composites as pneumatic actuators. Advanced Functional Materials 22,1376-1384 (2012).

Miyashita, S., Guitron, S., Ludersdorfer, M., Sung, C. R., Rus, D. An untethered miniature origami robot that self-folds, walks, swims, and degrades. IEEE Int. Conf. Robotics and Automation, pp. 1490-1496 (2015).

Mohr, R. et al. Initiation of shape-memory effect by inductive heating of magnetic nanoparticles in thermoplastic polymers. Proceedings of the National Academy of Sciences 103, 3540-3545 (2006).

Mu, J. et al. Origami-inspired active graphene-based paper for programmable instant self-folding walking devices. Science Advances 1, (2015).

Na, J. et al. Programming reversibly self-folding origami with micropatterned photo-crosslinkable polymer trilayers. Advanced Materials 27, 79-85 (2014).

Rus, D., Tolley, M. T. Design, fabrication and control of soft robots. Nature 521, 467-475 (2015).

Sakar, M. S. et al. Modeling, control and experimental characterization of microbiorobots. International Journal of Robotics Research 30, 647-658 (2011).

Shields, A. R. et al. Biomimetic cilia arrays generate simultaneous pumping and mixing regimes. Proceedings of the National Academy of Sciences 107, 15670-15675 (2010).

Sitti, M. Voyage of the microrobots. Nature 458, 1121-1122 (2009).

Tasoglu, S., Diller, E., Guven, S., Sitti, M., Demirci, U. Untethered micro-robotic coding of three-dimensional material composition. Nature Communications 5, 3124 (2013). doi:10.1038/ncomms4124.

Therien-Aubin, H., Moshe, M., Sharon, E., Kumacheva, E. Shape transformations of soft matter governed by bi-axial stresses. Soft Matter 11, 4600-4605 (2015).

Vilfan, M. et al. Self-assembled artificial cilia. Proceedings of the National Academy of Sciences 107, 1844-1847 (2010).

Wei, Z. et al. Hybrid hydrogel sheets that undergo pre-programmed shape transformations. Soft Matter 10, 8157-8162 (2014).

Xie, T. Tunable polymer multi-shape memory effect. Nature 464, 267-270 (2010).

Ye, C. et al. Self-(un)rolling biopolymer microstructures: rings, tubules, and helical tubules from the same material. Biomaterials 54, 8490-8493 (2015).

Ye, Z., Diller, E., Sitti, M. Micro-manipulation using rotational fluid flows induced by remote magnetic micro-manipulators. Journal of Applied Physics 112, 064912 (2012).

Extended European Search Report regarding related EP App. No. 191665423.5; dated Aug. 28, 2019.

* cited by examiner

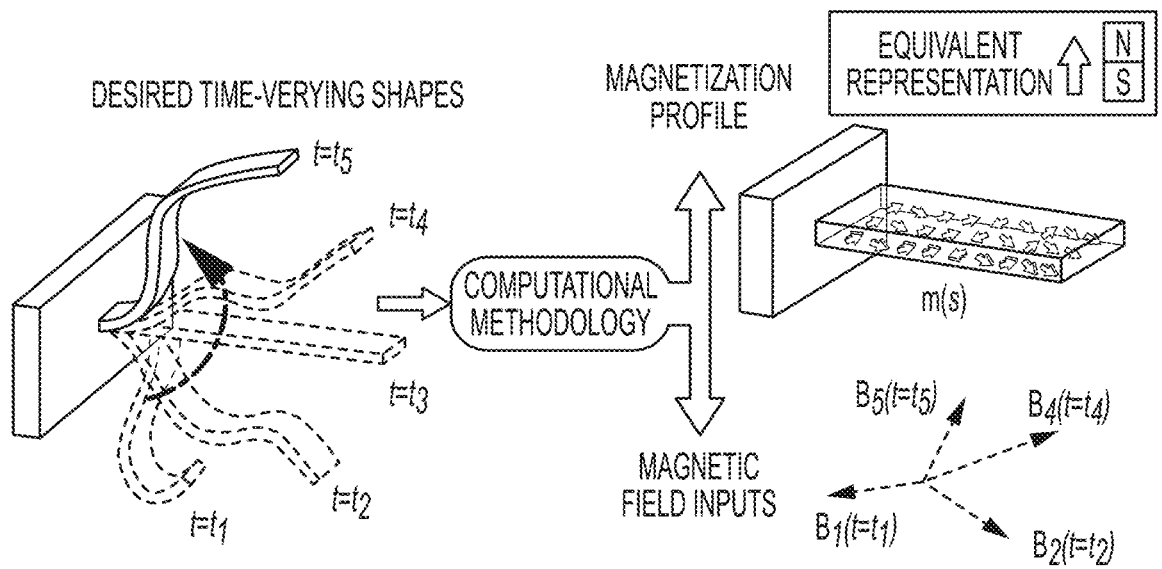
FIG. 1a
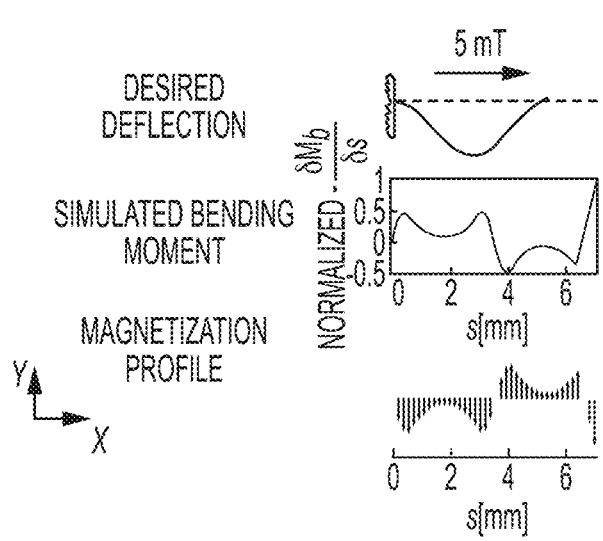
FIG. 1b(i)
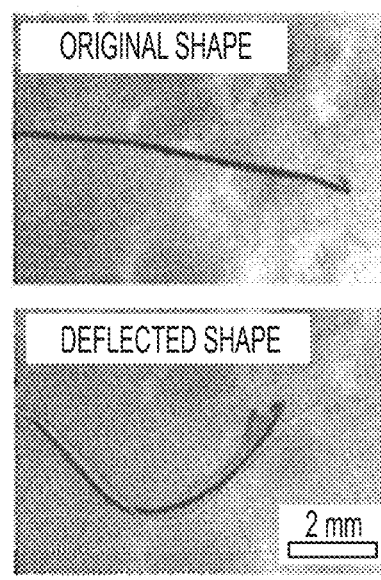
FIG. 1b(ii)

FIG. 3a
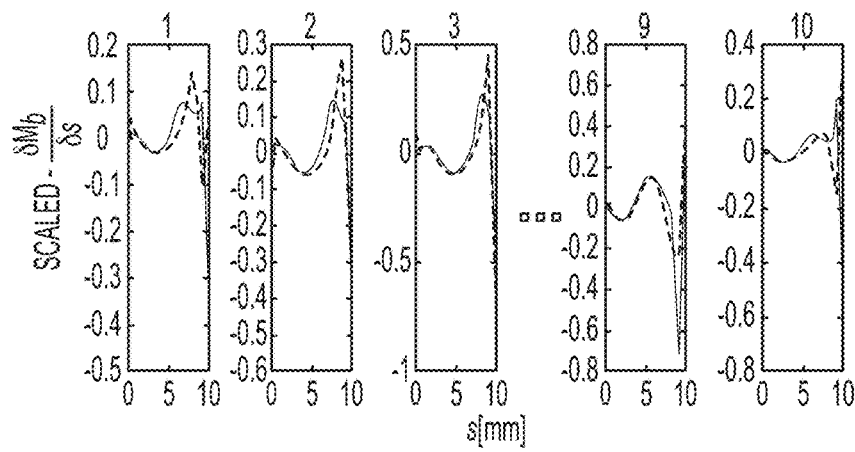
FIG. 3b
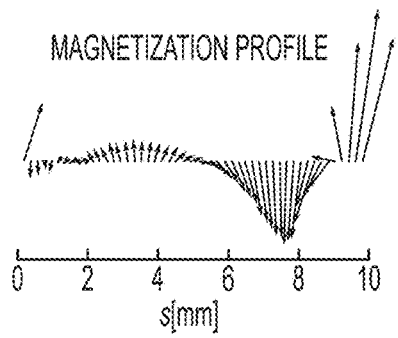
FIG. 3c(i)
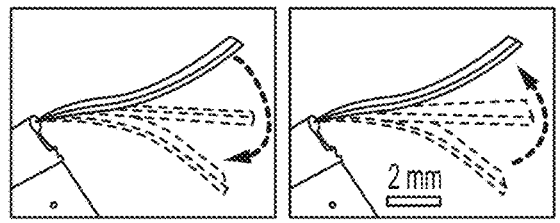
FIG. 3d(i)
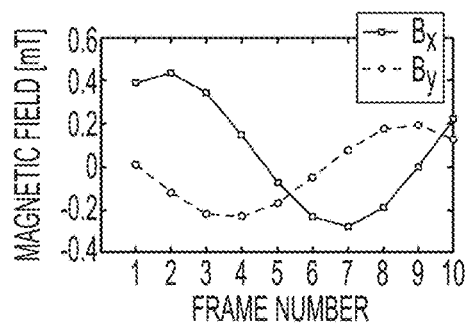
FIG. 3c(ii)
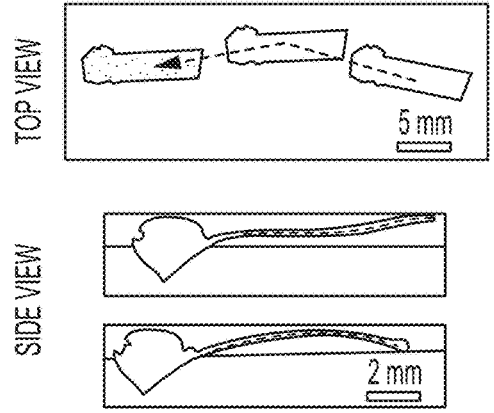
FIG. 3d(ii)

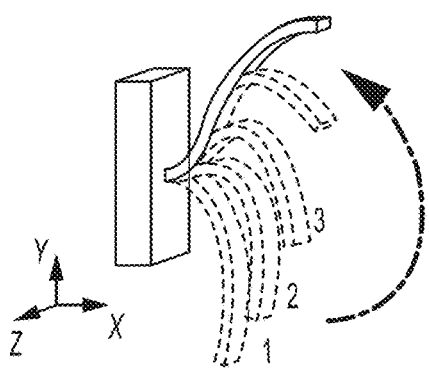
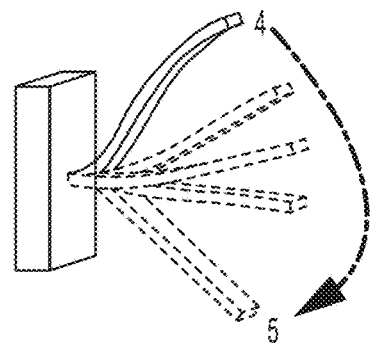
FIG. 4a(i)   FIG. 4a(ii)
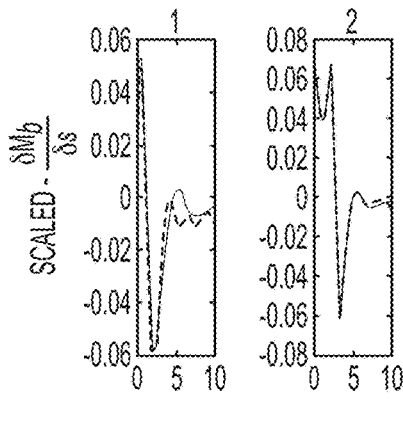
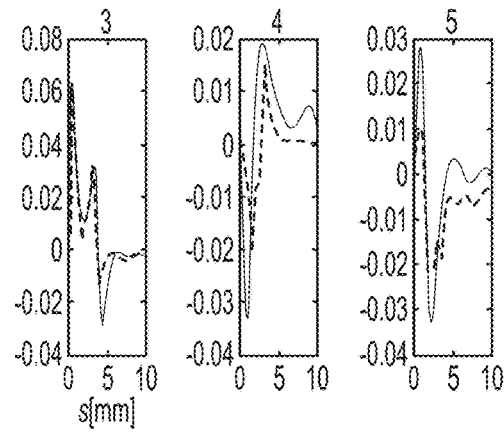
FIG. 4b
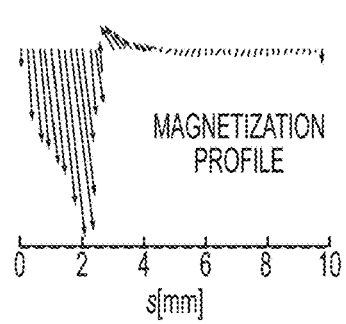
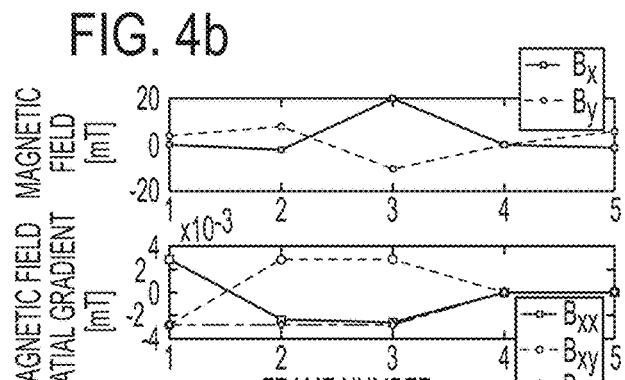
FIG. 4c(i)   FIG. 4c(ii)
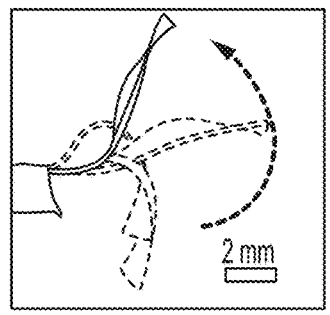
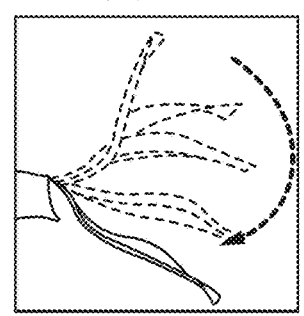
FIG. 4d(i) RECOVERY STROKE   FIG. 4d(ii) POWER STROKE

METHOD OF FABRICATING A SHAPE-CHANGEABLE MAGNETIC MEMBER, METHOD OF PRODUCING A SHAPE CHANGEABLE MAGNETIC MEMBER AND SHAPE CHANGEABLE MAGNETIC MEMBER

This application claims priority to European Patent Application No. 16175341.3 filed on Jun. 20, 2016, which is incorporated herein by reference in its entirety.

The present invention relates to a method of fabricating a shape-changeable magnetic member comprising a plurality of segments with each segment being able to be magnetized with a desired magnitude and orientation of magnetization, to a method of producing a shape changeable magnetic member composed of a plurality of segments and to a shape changeable magnetic member.

Shape changeable material is an active material that can control its geometry to potentially achieve mechanical functionalities unattainable by traditional machines. Unfortunately, these materials can typically only transform into one or two shapes when their overall dimensions reach ~1 cm or smaller on a short time scale.

Other materials are known which can transform into three or four shapes, however, this change is brought about on a comparatively long time scale of minutes or longer.

Yet other materials are known that can transform into two or more basic shapes that only enable gripping or crawling movements to be realized.

In view of the foregoing it is an object of the present invention to make available a method of producing small scale shape changeable materials of ~1 cm or smaller that can vary their shape very fast with a high spatial and temporal resolution. It is a further object of the invention to make available a method of producing such small scale shape changing materials in a reproducible and cost effective manner.

These objects are respectively satisfied by a method of fabricating a shape-changeable magnetic member by a method of producing a shape changeable magnetic member composed of a plurality of segments and by a shape changeable magnetic member as respectively defined in the independent claims.

According to a first aspect the present invention relates to a method of fabricating a shape-changeable magnetic member comprising a plurality of segments with each segment being able to be magnetized with a desired magnitude and orientation of magnetization, the method comprising the steps of:
  defining a first shape of the member;
  defining at least one second shape the member can adopt through the application of at least one magnetic field;
  determining a desired orientation and magnitude of magnetization for each of the plurality of segments, such that the member can at least approximately change its shape from the first shape to the at least one second shape through the application of the at least one magnetic field; and
  producing the member by forming each segment such that it at least substantially has the respective desired orientation and magnitude of magnetization when the member adopts the first shape in the absence of the at least one magnetic field.

The invention thus not only advantageously makes available the possibility of providing each segment with a differing magnitude of magnetic field, but in contrast to what was previously possible also permits a control of the orientation of the magnetic field.

Previously the magnitude of the magnetizable material was constant and thus could not be set. Moreover, the orientation of the respective adjacent segments was also predefined, so that it was not possible for each segment to be magnetized with a desired magnitude and orientation of magnetization which could vary from segment to segment in a desirable way.

In particular it was not possible to control the magnitude and orientation of magnetization along a length of the member.

A general methodology is made available by means of the invention to provide a variety of different shape changeable magnetic members that can be used in both static and in dynamic applications through the application of different kinds of magnetic fields. In this way very complex shapes and also multiple kinds of different shapes can be adopted by the member.

This is because the method permits the member to be programmed so that the shapes adopted in the magnetic field correspond to a physical function, so that by applying different fields different functions can be carried out.

This further permits the use of the shape changeable magnetic material as e.g. an artificial cilium that could mimic the complex beating patterns of their biological counterparts, a spermatozoid-like undulating swimmer, miniature scale devices such as robots etc.

Advantageously the method further comprises the step of defining between two to twenty, preferably two to ten shapes the member can adopt through the application of two to twenty preferably two to ten respective magnetic fields differing from one another to bring about a change of shape between the different shapes. Preferably the change in shape takes place in seconds or less, more particularly the change in shape can be brought about at a frequency of 100 Hz.

Preferably the magnetic field can have a constant field strength or a gradient, where the gradient is selected such that the shape-changeable magnetic member can propagate by changing its shape, i.e. to form a spermazotoid like movement thereof.

It is preferred if the desired orientation and magnitude of magnetization for at least one shape of the member is determined by determining the desired elastic deformations of a member at a spacing s along a length L from an end of the member having a plurality of segments of length ds, at a time t and at a point of deflection θ(s, t), the member having a constant cross-sectional area A, by solving the following iterative equation:

$$\tau_m + \int_s^L F_y ds \cos\theta - \int_s^L F_x ds \sin\theta = -\frac{EI}{A}\frac{\partial^2 \theta}{\partial s^2},$$

where E, and I represent Young's modulus and a second moment of area, respectively, where the applied magnetic torques and forces on the element are represented by $I_m(s, t)$, and $F_x(s, t)$ and $F_y(s, t)$, respectively, and where the directions of the magnetic forces is indicated by their subscript (x or y).

Using the solution of such an iterative equation n permits the fabrication of members having a constant cross-section and constant torsional stiffness over their length, i.e. the manufacture of rectangular shaped members.

It is further preferred if the desired orientation and magnitude of magnetisation for at least one shape of the member is determined by determining the desired elastic deformations of the member at a spacing s along a length L from an end of the member having a plurality of segments of length ds, at a time t and at a point of deflection θ(s, t), using the following iterative equation for the member having varying cross-sectional size A and/or varying moments of inertia I:

$$\tau_m(s, t)A(s) + \left[\int_s^L F_y(s, t)A(s)ds\right]\cos\theta - \left[\int_s^L F_x(s, t)A(s)ds\right]\sin\theta =$$
$$-EI(s)\frac{\partial^2 \theta}{\partial s^2}(s, t)$$

where E, I, L, and A represent Young's modulus and a second moment of area, respectively, where the applied magnetic torques and forces on the element are represented by $I_m(s, t)$, and $F_x(s, t)$ and $F_y(s, t)$, respectively, and where the directions of the magnetic forces are indicated by their respective subscript (x or y).

Solving such an iterative equation advantageously permits the manufacture of members that are non-uniform in their shape or in their torsional stiffness. For example, heart valves typically comprise 3 leaflets that together in the closed state approximately form the shape of a circle, thus in use as e.g. a heart valve a shape changing magnetic member can be provided that has an approximately triangular shape.

Preferably the step of producing the member includes the step of providing at least one mold into which a first mixture composed of at least an elastic material and a magnetizable material is introduced, with the shape of the mold defining the magnitude of the magnetization of the shape-changeable magnetic member or with the member being cut from a material formed in a mold to have a desired shape that can have the defined magnitude of the magnetization of the shape-changeable magnetic member or with a shape of the member being printed by use of a 3D printer.

In this way the magnitude of the magnetization of the magnetic member can be tailored to the specific application. This is because each segment can be provided with a different amount of magnetizable material which then corresponds to the final magnitude of magnetization.

Advantageously the step of producing the member includes the step of permanently magnetising the shape-changeable magnetic member in a magnetic field sufficient to bring about a permanent magnetization.

By permanently magnetizing the member it is ensured that the member maintains its shape changing capabilities.

In this connection it should be noted that the magnetic field applied to permanently magnetize the member depends on the magnetizable material selected but typically lies in the region of 1 to 3 T, whereas the magnetic fields applied to bring about the changes of shape of the member typically lie in the region of 1 mT to 100 mT.]

It is preferred if the step of permanently magnetizing the shape-changeable magnetic member is carried out using at least one jig having a pre-defined shape that subsequently defines the orientation of magnetization of the shape-changeable magnetic member.

The jig ensures that orientation of magnetization can at least approximately be set in the desired way. This is achieved by selecting the shape of the jig such that on permanently magnetizing the member each segment is aligned relative to that magnetic field, so that the magnetizable material aligns with the magnetic field applied.

Advantageously the shape-changeable magnetic member comprises at least two components selected from the group of components consisting of an elastic material, a magnetizable material, a filler material, a metallic filler material and combinations of the foregoing.

In this way different kinds of materials can be selected as the material of the magnetic member, so that this can e.g. have a constant stiffness with varying magnitude of magnetization a member comprising a elastic material, a magnetizable material, and a metallic filler material are selected.

Preferably the steps of defining the at least first and second shapes of the members is carried out to define a motion of the shape-changeable magnetic member when subjected, at least intermittently, to the at least one magnetic field.

Thus by applying a magnetic field whose field strength and/or orientation varies a shape changing magnetic member can be made available that is a dynamic member, i.e. it can move through a medium, e.g. like a spermatozoid-like undulating swimmer or a mini-robot comprising e.g. a camera that is inserted into the human body, e.g. in a blood vessel or into the intestine, and that can then scan structures present in the human body to which it is guided through the application of a magnetic field.

In a further aspect the present invention relates to a method of producing a shape changeable magnetic member composed of a plurality of segments, with the segments each having a desired orientation and magnitude of magnetization, optionally in accordance with at least one of the preceding claims, the method comprising the steps of:

providing a member composed of at least a first mixture of material comprising an elastic material and a magnetizable material;

wherein the member either has the first shape or is supplemented by a second mixture of material, to form the first shape, with the second mixture of material comprising at least an elastic material, preferably the elastic material, and a filler material;

placing the member into at least one jig having a pre-defined shape; and magnetizing the member in the jig with a magnetic field sufficient to bring about a permanent magnetization of the plurality of segments.

The jig ensures that orientation of magnetization can at least approximately be set in the desired way. This is achieved by selecting the shape of the jig such that on permanently magnetizing the member each segment is aligned relative to that magnetic field, so that the magnetizable material aligns with the magnetic field applied.

It should be noted that the advantages described above in connection with the method of fabricating a shape-changeable magnetic member likewise hold true in connection with this method.

It should also be noted that the member composed of the first mixture can be formed by introducing the first mixture into a mold or by cutting material of the first mixture from a rectangular member or by simply 3D printing said member.

It should also be noted that this separate method claims can also be a dependent step of the method of fabricating a shape-changeable magnetic member.

In this connection it is preferred if the shape of the jig is determined by the following equation:

$$\begin{cases} x_{jig}(s) = \int_0^s \cos(=\phi(s))ds \\ y_{jig}(s) = \int_0^s \sin(-\phi(s))ds \end{cases}$$

where s is the length of the member formed in the jig, x and y are the shape of the jig in the x and y directions, $\phi(s)=\tan^{-1}(m_y(s)/m_x(s))$, and $m_x$ and $m_y$ represent the x-axis and y-axis components of the magnetization profile, respectively.

In this way the best possible jig can be designed for the member so that this can adopt the different shapes and be provided with the desired orientation of magnetization at least approximately.

Preferably, if the jig has intersecting points, a multi-part jig is used to form individual segments of the shape changeable magnetic member.

In this way extremely complex members can be produced.

Preferably the individual segments are magnetized separately and subsequently bonded to one another, wherein the bonding together of the individual segments can be effected by using a bonding agent that e.g. comprises a mixture of Ecoflex and Aluminum, with the mixture having a mass ratio that is at least substantially similar to at least a mass ratio of the first mixture and optionally of a mass ratio of the first and second mixture.

Using this kind of mixture a permanent connection between the individual segments can be ensured.

In a further aspect the present invention relates to a shape changeable magnetic member that can be obtained by a method in accordance with the description provided herein, the member having a plurality of segments each having a respective desired orientation and magnitude of magnetisation, the member at least comprising an elastic material and a magnetisable material.

The advantages described in the foregoing in relation to the various methods also hold true for the shape changeable magnetic member.

Providing such a shape changeable magnetic member allows the member to dynamically change its shape when subjected to a magnetic field.

Preferably the magnitude of magnitisation is different for at least some of the plurality of segments.

Alternatively or additionally the orientation of magnetisation advantageously varies between adjacent segments.

It is preferred if the shape changeable magnetic member comprises a filler material. Such a filler material preferably has the same density and/or weight as the material of the shape changing member that has the shape changing properties. Moreover, this filler material can be inserted into the member to complement an outer and/or inner shape thereof. For example, it can be used to transform a shape changeable magnetic member of undulating outer shape into a shape changeable magnetic member having a rectangular shape.

Further embodiments of the invention are described in the following description of the Figures. The invention will be explained in the following in detail by means of embodiments and with reference to the drawing in which is shown:

FIGS. 1a, 1b(i) and 1b(ii) show the computational methodology and a simple proof-of-concept in order to prepare a shape changing member;

FIGS. 2a, 2b, 2c, 2d, 2e, 2f show the programming steps required to program soft composite materials that can gradually fold up into a semi-circle;

FIGS. 3a, 3b, 3c(i), 3c(ii), 3d(i) and 3d(ii) show the programming steps associated with programming a spermatozoid-like undulating soft swimmer;

FIGS. 4a(i), 4a(ii), 4b, 4c(i), 4c(ii), 4d(i) and 4d(ii) show the steps required to program an artificial cilium;

Figure 7:
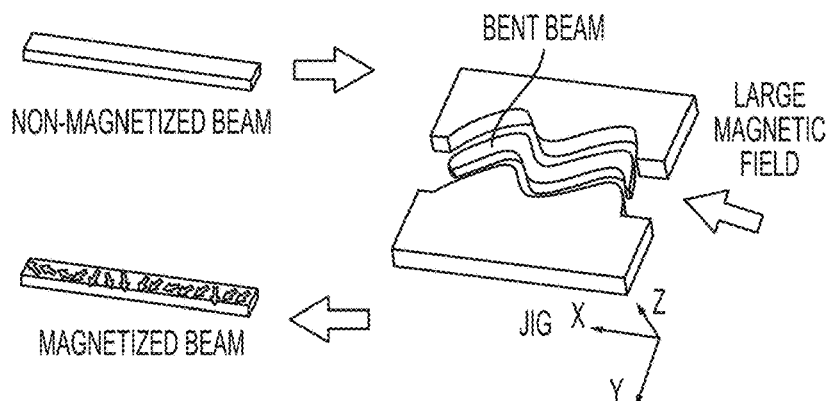
Figure 8:
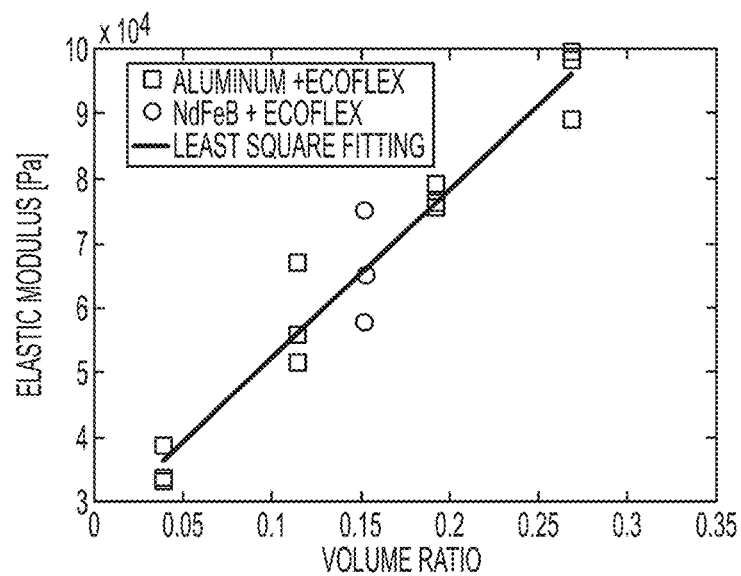
Figure 9:
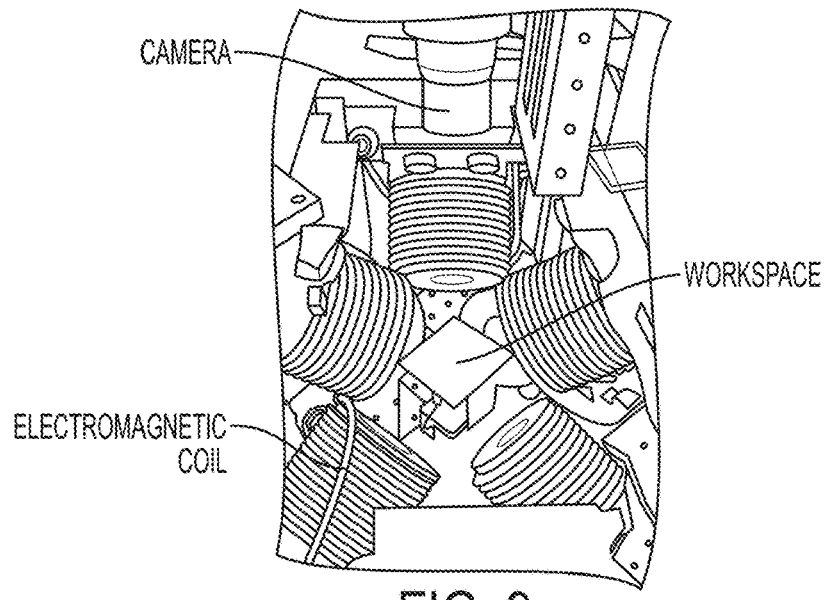
Figure 10A:
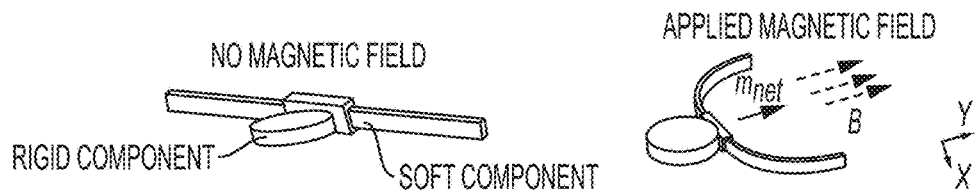
Figure 10B:
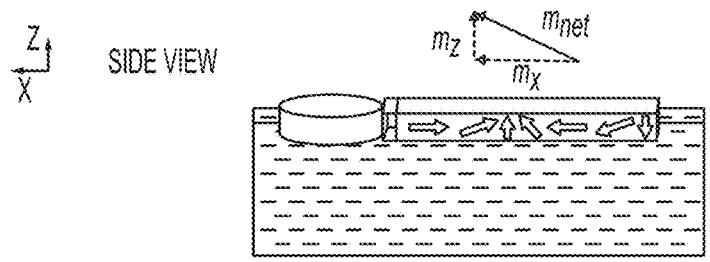
Figure 10C:
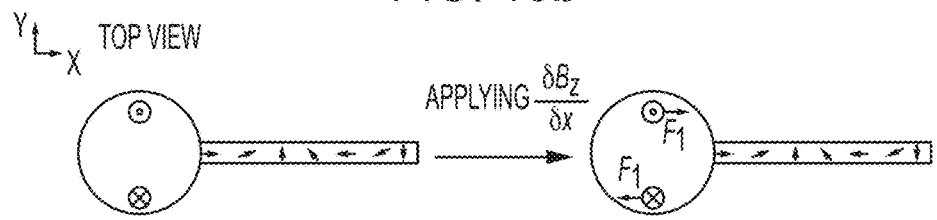
Figure 11A:
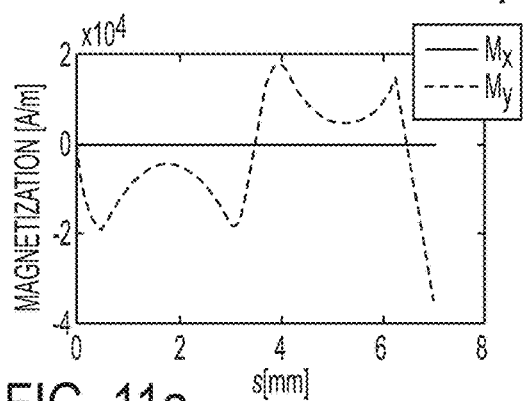
Figure 11B:
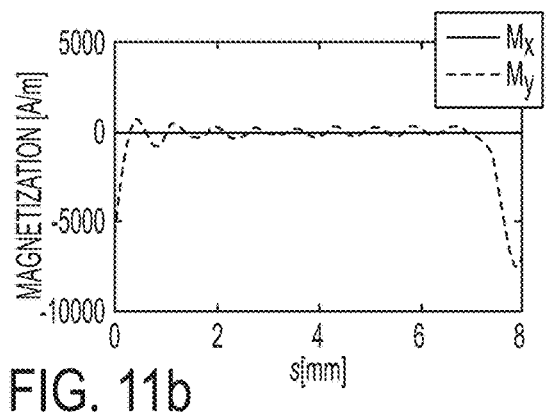
Figure 11C:
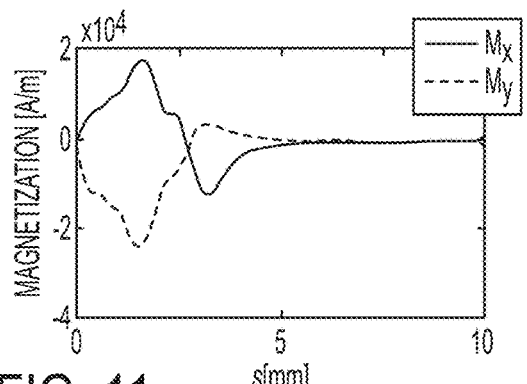
Figure 11D:
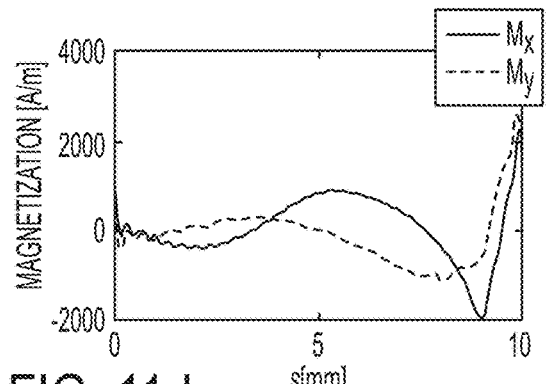

FIG. 7 the magnetization process of a soft beam;

FIG. 8 shows a tensile test of a mixture of Ecoflex and aluminum with different volume ratios of the aluminum powder;

FIG. 9 an electromagnetic coil system with eight coils that was used to generate the external magnetic field, B(t);

FIGS. 10a, 10b and 10c show strategies for steering an untethered programmable soft active device images of steps carried out in the glove mold method; and FIGS. 11a, 11b, 11c and 11d show a further kind of phantom comprising a transition region between a first region and a second region.

Any statements made having regard to the direction of a component are made relative to the position shown in the drawing and can naturally vary in the actual position of application.

FIG. 1 shows the computational methodology and a simple proof-of-concept in order to prepare a shape changing member. FIG. 1a shows the computational methodology used to magnetically program soft elastomeric composite materials with complex time-varying shapes (see FIG. 5a for the detailed computational methodology steps). This concept is illustrated with a straight beam that can be programmed to achieve the desired shapes shown on the left. The proposed approach uses numerical simulations to automatically determine the necessary magnetization profile, m(s), and magnetic field control inputs, B(t), for the material (shown on the right). The given m(s) and B(t) are only used as an illustration.

FIG. 1b shows a simple proof-of-concept of the proposed method in which a beam is programmed to create a shape resembling a cosine function when it is subjected to a 5 mT uniform magnetic field input. FIG. 1b(i) shows the desired shape, and simulated first derivative of the bending moment and necessary magnetization profile along the beam. The simulated first derivative of the bending moment plot has two overlapping curves. The lower curve represents the desired first derivative of the bending moment required to create the desired shape, and the upper red curve represents the first derivative of the bending moment generated by magnetic actuation. The plotted magnetization profile is along the pre-deformed beam (see FIG. 11 for a more quantitative representation for the magnetization). The obtained experimental results are shown in (ii). The slightly lower line represents the desired programmed shape for this demonstration. The beam achieved its programmed shape when it was subjected to a 5 mT magnetic field.

FIG. 2 shows the steps required to program soft composite materials that can gradually fold up into a semi-circle. FIG. 2a shows a schematic of a soft beam programmed to fold up under magnetic excitation. Although this motion was illustrated with only four shapes, there were a total of 100 distinct shapes throughout this motion.

Figure 2A:
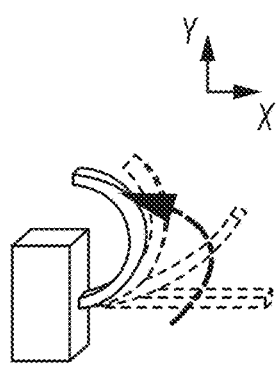
Figure 2B:
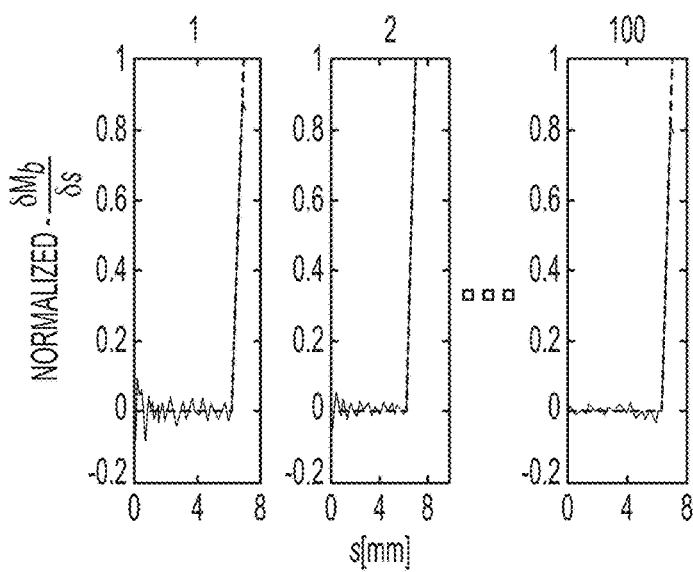

FIG. 2b shows the optimized results for the desired first derivative of the bending moment. Each plot represents the desired first derivative of the bending moment of the beam for one time frame. The frame number for each time frame is represented by the number at the top of it. In the simulations, the time difference between each time frame is 0.01 seconds. The full lines in the time frames represent the desired first derivative of the bending moment, and the dotted lines represent the obtained first derivative of the bending moment created by the magnetic actuation. The x-axis of each plot represents the length of the beam, which ranges from s=0 mm to 7 mm.

Figure 2C:
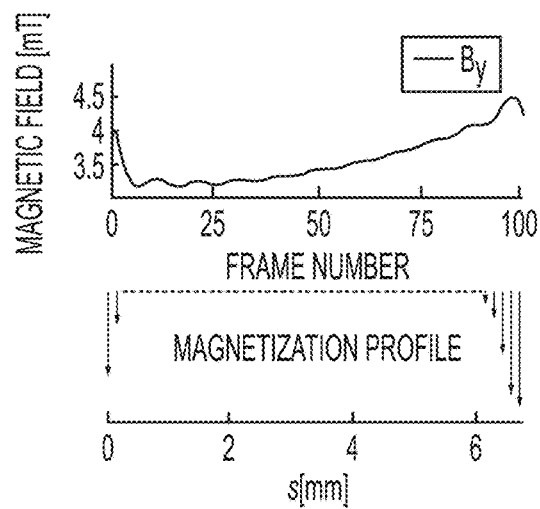

FIG. 2c shows the required magnetization profile, m(s), and the magnetic field, B(t), to achieve the desired time-varying shapes. This magnetization profile is along the pre-deformed straight beam (see FIG. 11 for a more quantitative representation for the magnetization profile). Using the coordinate system in a) as a reference, the variables $B_x$ and $B_y$ in the magnetic field plot represent the x- and y-axis components of the magnetic field, respectively.

Figure 2D:
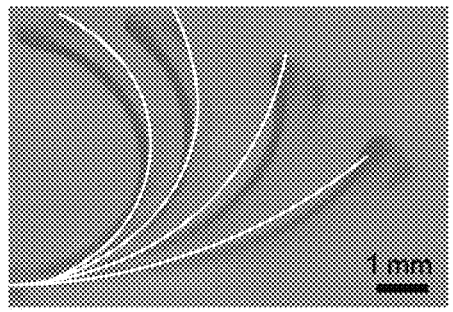

FIG. 2d shows snapshots of a single beam curling up under magnetic excitation. The yellow lines represent the corresponding desired time-varying shapes.

Figure 2E:
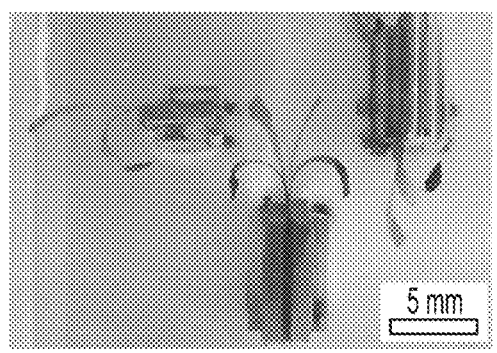

FIG. 2e shows four soft beams made of the programmable material are shown deforming into a reversible "CMU" logo under magnetic excitation. To visualize the logo better, the final "CMU" shape was highlighted with dotted red lines.

Figure 2F:
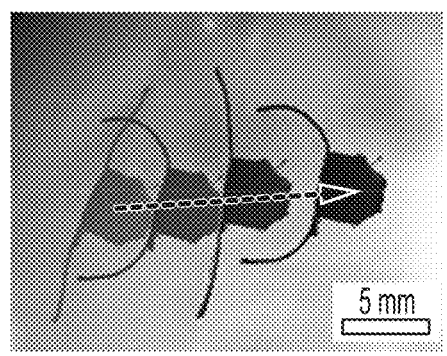

FIG. 2f shows a jellyfish-like robot equipped with two soft tentacles made of the programmable soft composite material. The robot could propel itself on an oil-water interface by bending its tentacles back and forth under magnetic excitation.

FIG. 3 shows the programming steps associated with programming a spermatozoid-like undulating soft swimmer. FIG. 3a shows the desired undulation, which requires a traveling wave with increasing amplitude from the left tip to the right tip. The entire motion can be divided into two strokes: (i) downward motion and (ii) upward motion. The associated time frame for each shape is represented by a corresponding frame number. In the simulations, the time difference between each time frame is 0.1 seconds.

FIG. 3b shows the optimized results for the desired first-derivative of the bending moment to achieve the undulation. Each plot represents the desired first derivative of the bending moment of the beam for one time frame. The frame number is represented by the number at the top. The blue lines represent the desired first derivative of the bending moment, and the dotted red lines represent the obtained first derivative of the bending moment created by the magnetic actuation. The x-axis for each frame corresponds to the length of the beam, which ranges from s=0 to 10 mm.

FIG. 3c shows the required magnetization profile and magnetic field for the swimmer. This is the magnetization profile along the pre-deformed beam (see FIG. 11 for a more quantitative representation for the magnetization profile). Using the coordinate system in a as a reference, the variables $B_x$ and $B_y$ in the magnetic field plot represent the x-axis and y-axis components of the magnetic field, respectively. FIG. 3d shows snapshots extracted from the video of the (i) tethered and (ii) untethered undulating swimmer.

FIG. 4 shows the steps required to program an artificial cilium. FIG. 4a shows the extracted two-dimensional natural cilia motion as expressed in Cartesian coordinates. The motion pattern includes two strokes: (i) the recovery stroke and (ii) the power stroke. The key time frames used by the artificial cilium are associated with a corresponding frame number. The time difference between each time frame is 0.2 seconds.

FIG. 4b shows optimized results for the desired first-derivative of the bending moment to achieve the cilium motion. Each plot represents the desired first derivative of the bending moment of the beam for one time frame. The frame number is represented by the number at the top of it. The blue lines represent the desired first derivative of the bending moment, and the dotted red lines represent the obtained first derivative of the bending moment created by the magnetic actuation. The x-axis for each frame corresponds to the length of the beam, ranging from s=0 to 10 mm. The frames in the middle of the motion were given more weight during the optimization process because they were more important.

FIG. 4c(i) shows the required magnetization profile and FIG. 4c(ii) shows the magnetic field and its spatial gradients for the cilium (see FIG. 11 for a more quantitative representation for the magnetization profile). Using the coordinate system in FIG. 4a as a reference, the variables $B_x$ and $B_y$ in the magnetic field plot represent the x-axis and y-axis components of the magnetic field, respectively. The spatial gradients $B_{xx}$, $B_{xy}$, and $B_{yy}$ represent $$\frac{\partial B_x}{\partial x}, \frac{\partial B_y}{\partial x}, \text{ and } \frac{\partial B_y}{\partial y},$$

respectively. FIG. 4d shows snapshots extracted from the video of the beating artificial cilium.

Figure 5A:
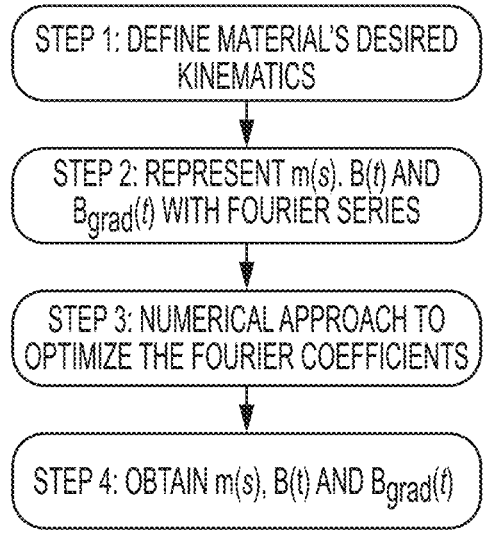
FIGS. 5a, 5b, 5c and 5d show the programming steps and results required to create desirable time-varying shapes.
Figure 5B:
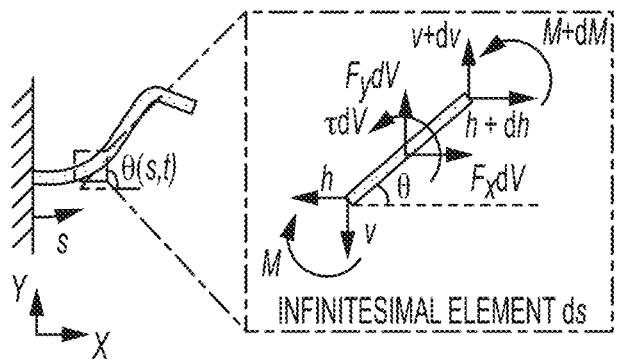

FIG. 5a shows the programming steps required to create desirable time-varying shapes. FIG. 5b shows the computational results based on the desired kinematics in FIG. 5b(i), a quasi-static analysis can be conducted on FIG. 5b(ii).

Figure 5C:
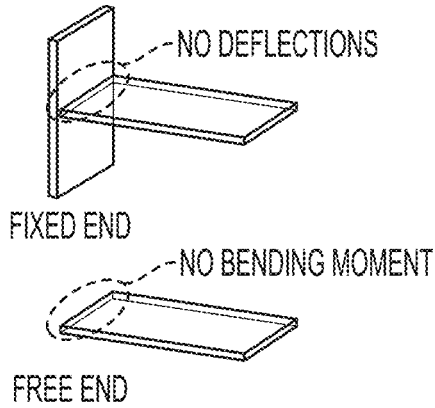

FIG. 5c shows the conditions used to obey the boundary conditions. For a fixed end, there should not be any deflections. By contrast, there should be no bending moment at the free end.

Figure 5D:
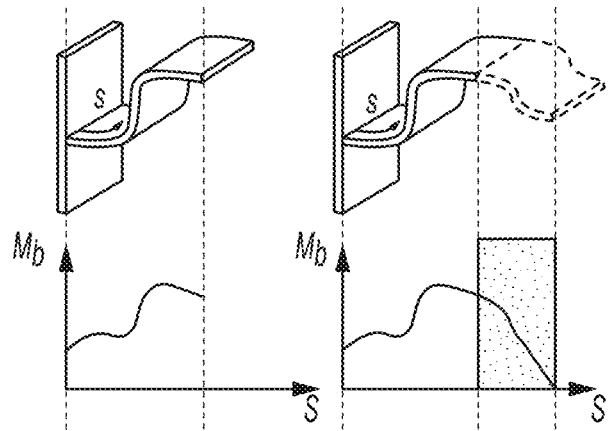

FIG. 5d shows the creation of an artificial extension to satisfy the boundary conditions for the free-ends. At all of the time instants, the bending moment at the free end should be zero, as achieved by introducing an artificial extended free-end (indicated by the red portions). The bending moment along this artificial extension was fitted by a polynomial function so that its bending moment at the free end was always zero.

FIG. 6 shows the fabrication procedure to create a programmable magnetic soft composite beam. FIG. 6a shows a negative mold for the beam. This mold is formed like a rectangle to form a rectangular shaped magnetized member.

Figure 6A:
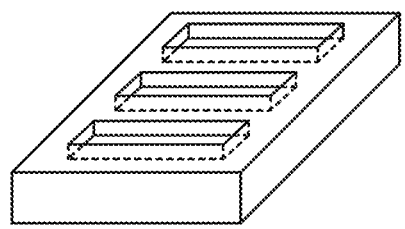
FIGS. 6a, 6b, 6c, 6d, 6e and 6f show the fabrication procedure to create a programmable magnetic soft composite beam.
Figure 6B:
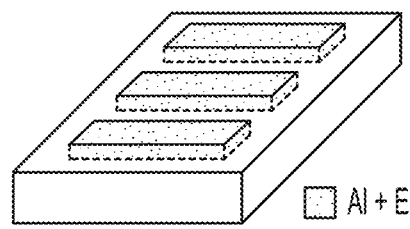

In a first step the mold is filled with a passive component in order to form a rectangular shaped member. FIG. 6b shows the mold filled with the passive component. A mixture of Al and Ecoflex was used as the passive component and simply poured into the mold in liquid form and allowed to cure.

Figure 6C:
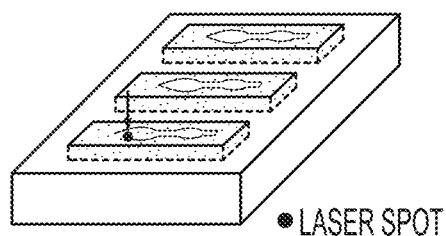

Having calculated the ideal shape required to form a magnetized member of desired magnitude and orientation, see e.g. equation 1, a negative mold for the magnetized component is formed in the passive component. FIG. 6c shows the step of removing the material of passive component to form a non-uniform width in the passive component by cutting out the material with a laser cutter. The shape of the band of non-uniform width is based on the programmed magnetization profile.

Figure 6D:
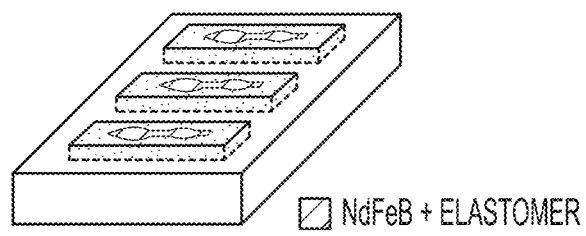

In a further step the magnetizable material, i.e. an active component, is filled into the negative mold formed in the passive component. FIG. 6d shows the active component, comprising a mixture of NdFeB and Ecoflex, that was poured into the mold formed by the passive component and cured.

Figure 6E:
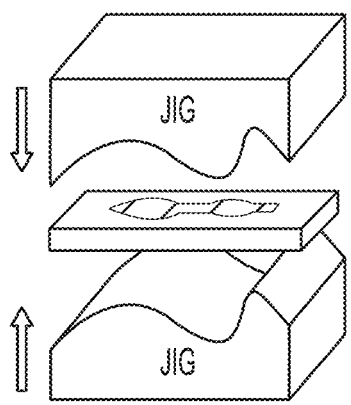

FIG. 6e shows the installation of the beam in a jig and how the beam was bent to fit into the jig's profile. The profile of the jig is based on calculations that enable the formation of a jig that can be used to form the shape changeable magnetized member. Equation 21 can be iteratively solved to design the magnetization profile that is to be introduced into the member by means of the jig and a source of magnetization.

Figure 6F:
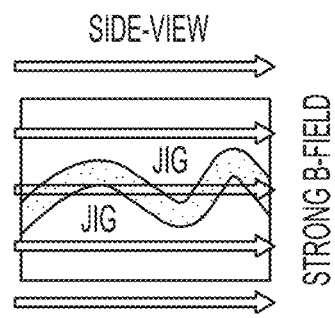

FIG. 6f shows the step of magnetizing the beam with a strong B-field (~1 T) in the jig. In order to magnetize the member this is placed adjacent to electric coils such as those shown in FIG. 9. Due to the shape of the jig, the member can be magnetized with a specific profile. Having provided a member with active material of non-uniform shape (see FIG. 6d) this is also magnetized with a non-uniform magnitude of magnetization.

FIG. 7 shows the magnetization process of a soft beam. The soft beam was placed in a jig, which was designed based on the magnetization profile from the simulation results. A large external constant uniform magnetic field was applied in the +x direction. The soft beam was then magnetically programmed by the applied magnetic field but due to its elastic nature can still recover to a straight shape after being removed from the jig.

FIG. 8 shows a tensile test of the mixture of Ecoflex and aluminum with different volume ratios of the aluminum powder. The data for the mixture of Ecoflex and aluminum is represented as circles, and the data for the mixture of Ecoflex and NdFeB are represented as squares. A linear model was fitted with the parameters shown in the figure.

FIG. 9 shows an electromagnetic coil system with eight coils that was used to generate the external magnetic field, B(t). In the experiments, the shape-programmable materials were placed in a container filled with water or oil, and the container was in turn placed in the center of the workspace of the electromagnetic coil system. The time-varying shapes of the beams were recorded by the camera.

FIG. 10 shows strategies for steering an untethered programmable soft active device. Each coordinate frame represents the device's body frame. FIG. 10a shows that by designing the tentacles of the jellyfish-like robot to be symmetrical about its body frame's y-axis, the net magnetization was designed to always be parallel to its body frame's y-axis. By changing the direction of B, the orientation of the robot was aligned with the field.

FIG. 10b shows that the material is constrained on a water surface if the member is placed into water. The magnetic torque created by m, was counterbalanced by the surface tension of the water. The orientation of the material was controlled by applying a B in the x-y plane, where the $m_x$ of the net magnetization would align with the applied B.

FIG. 10c shows how a rigid component with a programmed magnetization profile can be added. By applying a spatial gradient, $$\frac{\partial B_z}{\partial x}$$

the rigid component experienced a coupled force, $F_1$, that allowed it to rotate about the z-axis.

FIG. 11: Quantitative representation for the magnetization profiles for all the showcases when they were un-deformed. a. Magnetization profile for the cosine showcase. b. Magnetization profile for the jellyfish-like robot and reversible "CMU" logo. c. Magnetization profile for the artificial cilium. d. Magnetization profile for the spermatozoid-like undulating swimmer.

Shape-programmable magnetic materials have more potential to create complex time-varying shapes than do other shape-programmable materials that are controlled by heat, light, chemicals or pressure because the magnetic field control inputs can be specified not only in their magnitude but also in their directions. While shape-programming via magnetic means has the potential to create a new paradigm of programmable matter, this concept is relatively new. The discussion on this subject in prior literature is limited to fabrication processes that can create direction-varying magnetization profiles within magnetic materials, and to custom showcases which rely heavily on human intuition. The critical programming steps to acquire the necessary magnetization profile and magnetic field control inputs for complex time-varying shapes have not yet been developed. In view of these challenges, a generic computational methodology is presented that can magnetically program soft elastomeric composite materials to achieve fast time-varying shapes (with transformations <1 second) with high spatial and temporal resolutions.

Although this methodology can also be applied to macro-scale devices (see item 1.6 in the following), the discussions presented herein will primarily focus on miniature devices, which have overall dimensions that are approximately 1 cm or smaller. Despite being only equipped with simple functionalities such as rigid-body and gripping motions, existing untethered miniature devices have already been employed across a wide range of applications pertaining to microfluidics, microfactories, bioengineering, and healthcare. The proposed methodology could therefore increase the impact of these devices as it has the potential to significantly enhance their locomotion and manipulation capabilities.

A unique advantage of the proposed methodology is that it is not inhibited by the limits of human intuition since it uses numerical simulations to automatically generate the necessary magnetization profile, m, and actuating magnetic fields, B (FIG. 1a). The computational method was implemented to create desired two-dimensional shapes in this study for simplicity, but it could be directly extended to three-dimensional shapes in the future (see item 1.3). For the simulations pertaining to miniature devices, practical constraints were considered, such as having a time-invariant m and a position-invariant B. These constraints are necessary because it is neither easy to re-magnetize the device when in situ nor easy to use the electromagnetic system presented herein (see FIG. 9) to create extremely large spatial gradients in the magnetic field to achieve local variation for such small-scale devices.

The programming steps with beams that are subjected to quasi-static conditions (see FIG. 5a) are presented in the following. To simplify the discussion, the beams' cross-sectional area are constrained to be uniform and only allow them to bend in a plane. Following the steps in FIG. 5a, the desired elastic deformations along the beam's length, s are first defined. Because the desired elastic deformations can vary with time, t, the kinematics can be mathematically represented with the rotational deflections along the beam, θ(s, t) (FIG. 5b(i)). After the kinematics are specified, the Euler-Bernoulli theory can be applied and quasi-static analysis on an infinitesimal element, ds, at any time, t, to obtain a generic governing equation that is applicable for both small and large deformations (see FIG. 5b(ii)):

$$\tau_m + \int_s^L F_y ds\cos\theta - \int_s^L F_x ds\sin\theta = -\frac{EI}{A}\frac{\partial^2\theta}{\partial s^2}, \quad (1)$$

where E, I, L, and A represent the Young's modulus, the second moment of area, the length and the cross-sectional area of the beam, respectively. The applied magnetic torque and forces on the element are represented by $I_m(s, t)$, $F_x(s, t)$ and $F_y(s, t)$, and their values are dictated by m(s) and B(t). The direction of the magnetic forces, $F_x$ and $F_y$, is indicated by their subscript. The left-hand side of Eq. (1) represents the external magnetic actuation, and the right-hand side represents the required first derivative of bending moment to achieve the desired shape. The right-hand side of the equation can also be written as $$-\frac{1}{A}\frac{\partial M_b}{\partial s},$$

where $M_b$ represents the bending moment. Equation (1) implies that the material's desired time-varying shapes can be achieved if the magnetic actuation can be programmed to balance the required bending moment across the entire length for all time. To determine the necessary m(s) and B(t) for the desired actuation, these are first represented with general Fourier series. This representation allows both m(s) and B(t) to include all possible functions, regardless of whether they are continuous or discrete. Subsequently, both m(s) and B(t) are automatically determined by numerically optimizing their Fourier series coefficients to approach the equality in Eq. (1) (see items 1.1-1.2). The material is then magnetized with m(s) by following the steps described in item 2, allowing it to generate the desired time-varying shapes when actuated by the obtained B(t).

As the first experimental demonstration of the shape-programming methodology, a millimeter-scale silicone rubber beam with embedded magnetic and metallic microparticles was programmed to create a single shape when it was subjected to a constant B (FIG. 1b(i)). By using the obtained m(s) from the presented computational method, it is shown that the beam achieved its desired cosine function shape when magnetically actuated (FIG. 1b(ii)) (See items 2-3 and FIGS. 6-8 for the material composition and fabrication of the beam). Next, the effectiveness of the presented methodology was demonstrated by programming various millimeter-scale beams to create multiple desired shapes. First, a composite silicone rubber beam was programmed that could achieve simple time-varying shapes. For this beam, the time-varying shapes were divided into 100 discrete time frames. In each time frame, the beam's curvature was held constant throughout its length, gradually increasing between each time frame, until the beam curls into a semi-circle (FIG. 2a). Despite having time-varying shapes, appropriate yet simple m(s) and B(t) were achieved that satisfied Eq. (1) (FIG. 2b-c). Using the obtained m(s) and B(t), the beam was experimentally manipulated to form the desired shapes (FIG. 2d). Because the required magnetization profile and magnetic fields were relatively simple, this concept was extended to simultaneously control multiple beams that had similar motions. By organizing several such beams in specific orientations, a reversible three-letter "CMU" logo (FIG. 2e) was created. This concept was further extended by using two similar beams to form the tentacles of a jellyfish-like robot, which can swim on an oil-water interface. By controlling the time-varying shapes of the tentacles, a power stroke and a recovery stroke are able to be created. When the speed of the power stroke was greater than that of the recovery stroke, a net propulsion that allowed the jellyfish-like robot to swim against the slope of the oil-water interface (FIG. 2f and item 1.6 for the discussion of changing the stroke speeds) was able to be created. The jellyfish-like robot was also steerable, and the details of such steering strategies were discussed in item 1.4 and FIG. 10.

It was also demonstrated that the proposed method could create highly complex time-varying shapes. To illustrate this, an undulating swimmer was created, as well as an artificial cilium that was able to approximately mimic the complex beating patterns of its biological counterpart. Although the feasibility of creating a magnetically actuated undulating soft swimmer had been previously demonstrated[16], the traveling waves along those swimmers were restricted to uniform amplitude. The creation of an undulating swimmer that has a traveling wave with non-uniform amplitudes is more challenging and has not yet been demonstrated. Thus, a propagating traveling wave similar to the swimming gait of a spermatozoid was created in this work, in which the amplitudes are gradually increased from the fixed end to the free end (FIG. 3a). The obtained m(s) and B(t) for creating the desired undulating swimmer are shown in FIG. 3c. By tethering the undulating soft swimmer, the created traveling wave on the swimmer's body (FIG. 3d(i)) was visually illustrated. It was further demonstrated that the untethered swimmer used its spermatozoid-like undulation to swim on an air-water interface (FIG. 3d(ii)).

Finally, an artificial soft cilium was created that was able to approximate the required beating pattern of a biological cilium. The biological beating pattern was divided into power and recovery strokes (FIG. 4a). Due to the high complexity of the motion, the solution could easily be trapped into a sub-optimal solution if only one optimization process was utilized. Thus, the programming steps for the artificial cilium were segregated into two sequential optimization processes. The first optimization determined the necessary m(s) and $B_{rec}$(t) for the recovery strokes. The obtained m(s) was subsequently fed into a second optimization process to determine the required $B_{pow}$(t) for the power strokes. The obtained results are shown in FIG. 4b-d. The key time frames and shapes that were utilized to closely mimic the complex beating pattern of a biological cilium are shown in FIG. 4a. Although other researchers have had some success in creating time-asymmetrical motions for their artificial cilia, the artificial cilium presented herein is the only one on a millimeter scale that can approximate the motions of a biological cilium.

While the proposed programming method is promising, there are several limitations that need to be addressed in future studies. First, although both m(s) and B(t) are represented with their corresponding optimal one-dimensional (1D) Fourier series, the obtained magnetic actuation cannot be represented by a two-dimensional (2D) Fourier series in terms of s and t. This fact implies that the proposed method cannot produce all possible shapes when m(s) is time-invariant and B(t) is position-invariant. However, this limitation may be moderated by developing more powerful electromagnetic systems that can allow B to change spatially. Theoretically, this moderation will allow the presented method to produce a larger range of feasible shapes (see item 1.6). While a complete analysis to determine the range of feasible shapes that can be achieved by the presented method is beyond the scope of this paper, a brief discussion on this topic is provided in item 1.5. Second, several metastable shapes may exist for a given control input, and these shapes may cause the programmable material to deform into an undesired shape. Because the selected metastable shape is highly dependent on the previous shape, this limitation can be moderated by using a finer temporal resolution for the shape trajectories. This moderation reduces the deviation between the desired shape and the previous shape, making it easier to guide the material to deform into the desired shape. Third, because the proposed method uses a numerical optimization approach, the obtained solution may not be the globally optimal solution. New numerical techniques, such as the one used for the cilium case, can be used to overcome this limitation. Fourth, while a generic theory is provided in items 1.1-1.3, these are limited by the currently available fabrication techniques from experimentally program materials that are smaller than millimeter-scale and also materials with non-planar three-dimensional geometries.

In this way a systematic methodology was introduced that can guide scientists and engineers to magnetically program desired time-varying shapes for soft materials. The method was validated with a simple showcase, and its effectiveness was demonstrated by creating a reversible three-letter logo, a jellyfish-like robot, a spermatozoid-like undulating swimmer, and an artificial cilium. Compared to other shape-programmable materials that may require minutes to induce a shape change, the presented devices can transform into their desired shapes within seconds. It is envisioned that this methodology may enable researchers to develop novel soft programmable active surfaces and devices that could be utilized in robotics, engineering, materials science, and medicine.

In order to determine the desired orientation and magnitude of magnetization for at least one shape of the member one has to determine the desired elastic deformations of a member at a spacing s along a length L from an end of the member having a plurality of segments of length ds, at a time t and at a point of deflection θ(s, t), the member having a constant cross-sectional area A, this is done by solving equation 1.

In the following the derivation of this equation will be discussed in detail.

1.1 Derivation of Equations used to Determine a Desired Orientation and Magnitude of Magnetization for each of the Plurality of Segments:

In the following the detailed quasi-static analysis and optimization formulations for programming magnetic soft materials with time-varying shapes will be presented. In particular, the critical steps to acquire the necessary magnetization profiles and actuating magnetic fields are provided. These analyses are valid for beams that have large or small bending deflections. Although the boundary conditions of the beam are critical and will be discussed in the next sub-section, the analysis will start with these boundary conditions: the beam is fixed at s=0 and has a free end at s=L (FIG. 5b(i)). Using these boundary conditions and without any loss in generality, the bending deflections of the beam with a global frame that has its z-axis parallel to the beam's bending axis is described.

Due to the assumption that the shape of the beam is known across all time frames, the torque balance equation for an arbitrary infinitesimal element that is shown in FIG. 5b(ii) at a given time, t, can be expressed as $$\tau_m A + v\cos\theta - h\sin\theta = -\frac{\partial M_b}{\partial s}. \tag{2}$$

The variable $M_b$ represents the beam's bending moment, and h and v correspond to the x- and y-axis internal forces within the beam, respectively. In a similar manner, the force balance equations of the infinitesimal element can be expressed as $$F_x = -\frac{1}{A}\frac{\partial h}{\partial s}, F_y = -\frac{1}{A}\frac{\partial v}{\partial s}. \tag{3}$$

Thus, by using the Euler-Bernoulli equation and substituting Eq. (3) into Eq. (2), the desired deflections can be expressed explicitly by the actuating magnetic forces and torques as follows:

$$\tau_m + \int_s^L F_y ds \cos\theta - \int_s^L F_x ds \sin\theta = -\frac{EI}{A}\frac{\partial^2 \theta}{\partial s^2} \tag{4}$$

The applied magnetic forces and torques are dictated by the magnetization profile and actuating magnetic fields, and their relationships can be mathematically described as $$\begin{cases} \tau_m = [0 \quad 0 \quad 1]\{R(s,t)m(s) \times B(t)\} \\ F_x = [1 \quad 0 \quad 0]\{[R(s,t)m(s)] \cdot \nabla\}B(t) \\ F_y = [0 \quad 1 \quad 0]\{[R(s,t)m(s)] \cdot \nabla\}B(t) \end{cases} \tag{5}$$

The rotational matrix, R(s, t), is used to account for the orientation change in the magnetization profile due to the beam's large deflection, and it is given as $$R = \begin{pmatrix} \cos\theta & -\sin\theta & 0 \\ \sin\theta & \cos\theta & 0 \\ 0 & 0 & 1 \end{pmatrix} \tag{6}$$

In contrast to other magnetic programming studies, human intuition to derive the necessary m(s) and B(t) is not used. Rather computers are used to automatically generate these parameters. This is achieved by first representing them with a Fourier series:

$$m(s) = \begin{bmatrix} \sum_{i=0}^{n}\{a_i\cos(i\omega_s s) + b_i\sin(i\omega_s s)\} \\ \sum_{i=0}^{n}\{c_i\cos(i\omega_s s) + d_i\sin(i\omega_s s)\} \\ 0 \end{bmatrix}, \tag{7}$$

$$B(t) = \begin{bmatrix} \sum_{j=0}^{m}\{\alpha_j\cos(j\omega_t t) + \beta_j\sin(j\omega_t t)\} \\ \sum_{j=0}^{m}\{\gamma_j\cos(j\omega_t t) + \eta_j\sin(j\omega_t t)\} \\ 0 \end{bmatrix},$$

-continued $$\begin{bmatrix} \dfrac{\partial B_x}{\partial x} \\ \dfrac{\partial B_y}{\partial x} \\ \dfrac{\partial B_y}{\partial y} \end{bmatrix} = \begin{bmatrix} \sum_{j=0}^{m}\{\epsilon_j \cos(j\omega_t t) + \delta_j \sin(j\omega_t t)\} \\ \sum_{j=0}^{m}\{\lambda_j \cos(j\omega_t t) + \mu_j \sin(j\omega_t t)\} \\ \sum_{j=0}^{m}\{\rho_j \cos(j\omega_t t) + \sigma_j \sin(j\omega_t t)\} \end{bmatrix}.$$

Thus, by substituting the fitting functions in Eq. (7) into Eq. (1), this can be rewritten as $$\sum_{i=0}^{n}\sum_{j=0}^{m}\{[a_i\gamma_j - c_i\alpha_j]\cos\theta\cos(i\omega_s s)\cos(j\omega_t t) + \quad (8)$$

$$\ldots - [d_i\eta_j + b_i\beta_j]\sin\theta\sin(i\omega_s s)\sin(j\omega_t t)\} +$$

$$\cos\theta \sum_{i=0}^{n}\sum_{j=0}^{m}\left\{[a_i\lambda_j + c_i\rho_j]\int_s^L \cos\theta\cos(i\omega_s s)\cos(j\omega_t t)ds + \right.$$

$$\left. \ldots - [b_i\sigma_j - d_i\mu_j]\int_s^L \sin\theta\sin(i\omega_s s)\sin(j\omega_t t)ds\right\} - \sin\theta$$

$$\sum_{i=0}^{n}\sum_{j=0}^{m}\left\{[a_i\epsilon_j + c_i\lambda_j]\int_s^L \cos\theta\cos(i\omega_s s)\cos(j\omega_t t)ds + \ldots - [b_i\mu_j - \right.$$

$$\left. d_i\delta_j]\int_s^L \sin\theta\sin(i\omega_s s)\sin(j\omega_t t)ds\right\} = -\frac{EI}{A}\frac{\partial^2\theta}{\partial s^2},$$

where the left-hand side of the equation is a linear combination of the products of the Fourier coefficients. A computational approach is used to determine the ideal values of the Fourier coefficients so Eq. (8) can be satisfied. First, the motion of the beam is discretized into p number of time frames, i.e., $t=t_0$; $t=t_1$; . . . ; $t=t_p$. Similarly, in each time frame, the length of the beam is divided into q number of segments, i.e., $s=s_0$; $s=s_1$; . . . , $s=s_q=L$. Thus, q new equations for each time frame are created by substituting different values of s across the entire beam length into Eq. (8). By assembling all of the equations across all time frames, there are a total of p×q equations that are linearly dependent on the products of the one-dimensional Fourier coefficients. This can be written in matrix form as $$Ku=M_b. \qquad (9)$$

Subsequently, the ideal Fourier coefficients are solved by performing the following optimization process:

minimize $f=(Ku-M_b)^T Q(Ku-M_b)$ subjected to: $|m(s)| \leq m_{max}$, $|B(t)| \leq B_{max}$ (10)

where Q is a matrix that gives different weightings/importance to different time frames/shapes. The time frames/shapes that are deemed to be more important have higher weightings. Physically, the optimization process in Eq. (10) minimizes the difference/errors between the magnetic actuation and the required first derivative of the bending moment within the beam. This optimization process is solved numerically by using solvers, such as a genetic algorithm and gradient-based solvers. More information pertaining to the nature of these solvers can be found in.

After the optimization solvers determined the ideal Fourier coefficients, the necessary m(s) and B(t) required to achieve the desired time-varying shapes were determined. The benefit of using Fourier series to represent m(s) and B(t) is that they are inclusive of all possible mathematical functions. Thus, this enables the proposed programming method to be highly versatile, and it can be used as a generic approach.

1.2 Boundary Conditions

To achieve the desired shapes, the boundary conditions of the beams must always be satisfied. Generally, there are two types of boundary conditions: the fixed and free ends of the beam (FIG. 5c). For the fixed ends of the beams, the desired kinematics, such as the vertical and rotational deflections, must be zero at all time-instants. However, because it is difficult to create rigid-body torques at the free ends, the bending moment at the free ends must be constrained to zero. However, because not all time-varying shapes have a zero bending moment at their free end, a method that can overcome this limitation is introduced (see FIG. 5d).

The proposed method is to extend the desired length of the beam artificially. Subsequently, the bending moment of the beam of the artificial extension is gradually reduced to zero by using a polynomial fitting curve (FIG. 5d). The necessary magnetization profile for this extension can be determined to satisfy the free-end boundary condition by including the artificial extension into the Fourier series representation of m(s). This method was used to program the cosine function, jellyfish-like robot and the spermatozoid-like undulating swimmer. It is not necessary to utilize this method for the artificial cilium because its desired motions have automatically satisfied the free-end boundary condition.

1.3 Programming Materials with Non-Planar Shapes

Similar to the formulations for programming beams, the desired time-varying displacement fields (u, v, w) for the materials is initially specified. Based on these deflections, the time-varying deformation gradient tensor, F, and strains can be computed. The resultant time-varying strains across the materials are given as $$\begin{cases} e_{ij} = \dfrac{1}{2}(u_{i,j} + u_{j,i}) \\ \omega_{ij} = \dfrac{1}{2}(u_{i,j} + u_{j,i}) \\ \varepsilon_{ij} = e_{ij} + \dfrac{1}{2}(e_{ki} + \omega_{ki})(e_{kj} + \omega_{kj}) \end{cases} \qquad (11)$$

where $\varepsilon_{ij}$ is the component of the Lagrangian strain tensor and the subscripts indicate the Cartesian directions, i.e., i, j, k=1, 2, 3. The above equations are written in index notation for convenience. The relationship between the strains and stresses within the materials can be expressed by $$S=C\varepsilon \qquad (12)$$

where S is the stress tensor in Lagrangian description, i.e., the second Piola-Kirchhoff stress ($2^{nd}$ PK stress), and C is a 9×9 matrix of the coefficients determined by the material properties.

After the stress distribution within the materials is determined, the quasi-static analysis is established. As it is more desirable to perform the quasi-static analysis in Eulerian description, the $2^{nd}$-PK stress is converted into the Cauchy stress in the Eulerian description as $$\sigma = j^{-1} F \cdot S \cdot F^T \qquad (13)$$

where J=det(F). According to a theory for electromagnetic-elastic solids, the quasi-static equations can be written in index notation as $$\begin{cases} \sigma_{kl,i} + f_i = 0 \\ (\sigma_{kl} - \sigma_{lk}) + \tau_i = 0 \end{cases} \quad (14)$$

where $\sigma_{ij}$ is the component of the Cauchy stress tensor and $f_i$ and $\tau_j$ are the external body force and torque per unit volume in the $i^{th}$-direction, respectively. The external body forces and torques per volume that are applied from the magnetic field are functions of the local magnetization vector, m:

$$\tau_m = m \times B \text{ and } f_m = (\nabla B) \cdot m \quad (15)$$

When Eq. (15) is expressed in index notation, it becomes $$\begin{cases} f_i = m_i B_{i,j} \\ \tau_i = B_k m_l - B_l m_k = \epsilon_{kli} m_l B_k \end{cases} \quad (16)$$

Because one must account for the change in the magnetization profile after the material has deformed, the magnetization profile has to be mapped from its initial un-deformed state to the current deformed state. Because m is defined as the magnetization per unit volume, its magnitude varies similarly to the density of a body that undergoes a deformation. Thus, m can be defined as $$m = \frac{dM}{dV} \quad (17)$$

where dM is magnetic moment within the volume of dV. When a deformation occurs, the magnetic moment changes its orientation, and the magnitude of the volume is also changed:

$$dM' = RdM$$

$$dV' = JdV \quad (18)$$

where R is the rotational component of F, which can be found by the polar decomposition of F. Therefore, the magnetization vector under deformation can be written as $$m' = \frac{dM'}{dV'} = \frac{RdM}{jdV} = \frac{R}{J}m \quad (19)$$

This implies that the magnetic torque/forces in the deformed state can be expressed as $\tau_m' = m' \times B$ and $f_m' = (\nabla B) \cdot m'$. By substituting these variables back into Eqs. (14) and (16), the equilibrium equations expressed explicitly with the magnetic torques and forces are obtained. To generalize the approach to solve for these magnetic torques and forces, the Fourier series are again used to represent the magnetization profiles and magnetic fields. Similar to Eq. (10), an optimization approach is then used to determine the optimal Fourier coefficients. This determines the m and B necessary to achieve the time-varying shapes for a programmable material with non-planar geometries.

1.4 Steering Strategies

There are several strategies to steer untethered miniature devices magnetically. The first steering strategy is introduced by using the jellyfish-like robot as an example. To implement this strategy, the magnetization profile of the beams was intentionally constrained to be symmetrical around the y-axis of the robot's body frame (see FIG. 10a). This allowed the robot's net magnetization to always be parallel to its body frame's y-axis. The net magnetization of the programmable material, $m_{net}$, is given as $$m_{net} = A \int_0^L m(s) ds \quad (20)$$

Because the net magnetization of the robot always aligns with B(t), the directions of B(t) can be varied to control the orientation of the robot. Furthermore, because the required B to change the shape of the tentacles is always in the same direction, the shape of the tentacles' can be controlled by adjusting the magnitude of B(t) after the robot achieves its desired orientation.

In addition to the first strategy, two additional strategies are presented that allow untethered programmable materials to steer in a plane while being able to achieve their desired shape transformations. The second strategy is to constrain certain motions of the programmable material so that it is easier to steer the device. The last strategy is to include a rigid component that can be used to control the device's orientation.

The second strategy can be implemented by placing the material on a liquid interface in which the programmable material is constrained by the surface tension of the fluid. As an illustration, FIG. 10b shows the x-z plane of the programmable material's body frame. Due to the surface tension of the fluid, the z-axis components of the net magnetization cannot create rigid-body torques that affect the orientation of the material. Thus, the alignment of the material on the liquid interface is solely dependent on the body frame's x-axis component of the net magnetization. Thus, the robot's orientation can be controlled by using an applied B(t) to align this x-axis component of the net magnetization. This strategy was used to control the orientation of the undulating swimmer.

For the last steering strategy, one can control the orientation of the device by programming the magnetization profile of a rigid component. Multiple feasible magnetization profiles may exist, and an example is shown in FIG. 10c. In this case, although the net magnetization for the rigid-component is zero, this component can still provide a rigid-body torque that can be used to steer the orientation of the material. By following the body frame assignment in FIG. 10c, a rigid-body torque around the z-axis can be induced on the rigid component when the spatial gradient, $$\frac{\partial B_z}{\partial x},$$

is applied, allowing the material to steer in the x-y plane.

This spatial gradient also induces a z-axis force for the x-axis components of m(s), and the induced deflections into the plane can be greatly reduced by increasing the stiffness of the beam in that direction. This can be easily achieved by increasing the width of the beam. Thus, it is possible to compensate for any z-axis torque that is induced by the programmable material by controlling the magnitude of the spatial gradient, $$\frac{\partial B_z}{\partial x}.$$

1.5 Achievable Time-Varying Shapes

Although a complete analysis for determining the number of feasible shapes that are achievable with this method is beyond the scope of this application, a brief discussion is presented here. The proposed method cannot produce all possible time-varying shapes for small-scale materials because the materials have a time-invariant m and a global B that cannot be spatially changed. Thus, the number of programmable shapes for a material depends significantly on the complexity of the shape trajectories. For example, for simple time-varying shapes, such as those shown in FIG. 2, it is possible to create 100 shapes for the entire shape trajectories. However, for extremely complex time-varying shapes, such as those generated by the artificial cilium, 5 key shapes for the device can be planned. Currently, the only way to determine the number of achievable shapes is to perform the numerical optimization process shown above at 1.1. If the optimization cannot create the necessary magnetic actuation to match the desired first derivative of the bending moment, the number of shapes must be reduced. This process may have to be iterated several times until it is possible to obtain a good numerical solution. However, it is believed that the minimum number of continuous shapes achievable by the proposed method should be two because it is possible to pattern two axes of the magnetization profile independently, i.e., the x- and y-axis components of m(s).

1.6 Additional Discussion

In the following the possibility of extending the proposed approach to simultaneously determine the magnetization profile for multiple beams and the effects of a B that can be varied locally in space will be discussed. Finally, the possibility of changing the speed for the shape transformations in the experiments is discussed.

The programming method can determine the magnetization profile for multiple beams simultaneously by using multiple sets of the Fourier series to represent the magnetization profile of these beams. For example, if there are r numbers of beams, there will be r sets of Fourier series. Thus, for each time frame, one can create r×q new equations by substituting different values of s across each beam into Eq. (8). By assembling all of the equations across all time frames, there will be a total of p×r×q equations that are linearly dependent on the products of the one-dimensional Fourier coefficients. Using the formulations shown in Eq. 10, the optimal Fourier coefficients can be determined, thus generating the necessary magnetization profiles for all of the beams.

On the other hand, if B can be varied locally for I regions, there will be I number of independent B values, i.e., there will be $B_1, B_2, \ldots B_I$. Each of these magnetic fields can then be represented by a Fourier series, i.e., there are I sets of them. However, Eq. 8 will be slightly modified as one substitutes the corresponding B in each region. In a similar manner, the optimal Fourier coefficients can be solved by Eq. 10. The difference in a B that can be varied locally in space is that it allows the beam to create more feasible motions. Furthermore, a B that can be varied locally is more practical for materials in macro-scale because they can be achieved with smaller magnitudes of spatial gradients. There is no loss in generality to apply the proposed approach for programming macro-scale devices.

Lastly, the feasibility of changing the speed for inducing the shape changes is discussed. Physically, there is an upper speed limit for the programmable material to change its shape. This limit is dictated by either the speed of the electromagnetic system that generates the actuating magnetic fields or the fundamental natural frequency of the material. In the experiments, it is the speed of the electromagnetic system that limits the bandwidth to be 25 Hz. Based on this limitation, the fastest component of the Fourier series representing B to be 25 Hz has been constrained. Reducing the speed for the shape change is, however, much simpler and there is no lower bound for such a change. Thus, for the jellyfish-like robot, the speed of the recovery stroke has been reduced to be approximately 3 times slower than its power stroke.

2. Fabrication Techniques

In the following the fabrication technique to create the desired magnetization profile for a programmable beam is discussed. The required steps are illustrated in FIG. 6.

The programmable magnetic soft composite material consists of two components: a passive component and an active component that can be stimulated by magnetic excitation. The active component is created by embedding fine neodymium-iron-boron (NdFeB) particles that have an average size of 5 μm (MQFP, Magnequench) into a soft silicone rubber (Ecoflex 00-10, Smooth-on, Inc.). The volume ratio for the NdFeB particles and Ecoflex 00-10 is 0.15:1. However, the passive component is created by embedding aluminum (Al) powder with an average particle size of 5 μm into the same type of silicone rubber with the same volume ratio. The volume ratio of the active and passive components is selected such that their elastic modulus will match (see point 3 below), providing the composite with a uniform elastic modulus. The relationship between the passive component's volume ratio and its resultant elastic modulus was experimentally characterized (see point 3 in the following). To create a non-uniform magnetization profile that has a varying magnitude, the distribution between the passive and active components must be patterned. The locations that have a higher magnitude of magnetization will have more active components. To achieve this, a two-step micro-molding process was adopted. First, a negative mold that had the desired geometries of the beams was created by computer numerical control machining on an acrylic sheet. The passive component (in liquid form) was first poured into the negative mold and allowed to cure. Once the passive component was fully cured, a laser cutter was used to cut out a band that had a non-uniform width. Subsequently, the active component (in liquid form) was poured into the mold to replace the removed band. The two components formed a composite that had a uniform thickness once the active component was also cured. Due to the non-uniform width of the band, the distribution of the active components could be patterned. This allowed the beam to have a magnetization profile with a varying magnitude when the beam was magnetized by a uniform magnetic field (of approximately 1 T). The orientation of the desired magnetization profile was created by using jigs to bend/fold the beam during the magnetization process (FIG. 7). The curvature of the jigs can be mathematically represented by the following integral:

$$\begin{cases} x_{jig}(s) = \int_0^s \cos(-\phi(s))ds \\ y_{jig}(s) = \int_0^s \sin(-\phi(s))ds \end{cases} \quad (21)$$

where $\phi=\tan^{-1}(m_y(s)=m_x(s))$, and $m_x$ and $m_y$ are the x- and y-axis components of m(s) when the beam is undeformed. The desired jigs were fabricated with the laser cutter. Thus, by magnetizing the beam when it was sandwiched between the jigs, the desired magnetization profile could be obtained after the applied magnetic field and the jigs were removed. The NdFeB particles that were embedded within the active components were saturated by the large magnetizing field.

It should be noted in this connection that if the jig has intersecting points, it will be necessary to divide the jig/beam into multiple segments to prevent such intersections. Thus, each of these segments will have to be magnetized separately and subsequently 'glued' to reform the beam. This adhesive then can be glued using e.g. a mixture of Ecoflex+Aluminum, e.g. a material having the same mass ratio as that of the member.

3. Experimental Procedures This section describes the experimental procedures for matching the elastic modulus of the passive and active components. The procedures and setup for the experiments, which evaluate the performance of the programmable materials, are also discussed.

3.1 Matching the Elastic Modulus Properties

Because of the embedded metal particles, the elastic modulus of the composite materials is different from that of pure Ecoflex. The embedded aluminum and NdFeB powders were selected to have the same mean particles size of 5 μm. The volume ratio of the embedded NdFeB powder to Ecoflex in the active component was predetermined; hence, the component's elastic modulus was fixed. Therefore, the elastic modulus of the passive component, Ecoflex with embedded aluminum powder, was tuned by changing the volume ratio of the particles to Ecoflex. The elastic modulus of both the passive and active components was evaluated with a tensile testing machine (Instron 5943, Instron Inc.). Each volume ratio was evaluated with three experiments, and a linear model was fitted to represent the relationship between the elastic modulus and the volume ratio. Based on the fitted model, the necessary volume ratio for the passive component's elastic modulus to match the active components was determined (see FIG. 8). The corresponding mass ratio was obtained by $$\text{mass ratio} = \frac{\text{density of particle}}{\text{density of Ecoflex}} \times \text{volume ratio}. \tag{22}$$

3.2 Experimental Procedure

The magnetic field and its spatial gradients were generated by an electromagnetic coil system with eight coils, as shown in FIG. 9. The coil system can be controlled to generate the desired magnetic field and its spatial gradient in the workspace with a uniformity above 95% across a 2 cm×2 cm×2 cm volume. The mapping from the current in each coil and the resulting magnetic field and spatial gradient can be approximated in a linear form as $$AI = \begin{pmatrix} B \\ B_{grad} \end{pmatrix}. \tag{23}$$

The matrix A and vector I represent the actuation matrix and the currents for each coil, respectively. The magnetic field can be expressed as $B=[B_x\ B_y\ B_z]^T$ in the global frames shown in the figures, and the spatial gradients of B are represented by $B_{grad}$. Based on Gauss's Law of $\nabla \cdot B=0$ and Ampere's Law of $\nabla \times B=0_{3\times 1}$, there are only five independent components. Because there is more than one combination of $B_{grad}$, selected the following representation for $B_{grad}$ was selected:

$$B_{grad} = \begin{bmatrix} \frac{\partial B_x}{\partial x} & \frac{\partial B_x}{\partial y} & \frac{\partial B_y}{\partial y} & \frac{\partial B_z}{\partial x} & \frac{\partial B_z}{\partial y} \end{bmatrix}^T. \tag{24}$$

The shape change using the simulated magnetic field was recorded and its spatial gradients on the programmable beams.

The governing equation for a non-uniform cross-sectional area, A, and a non-uniform second moment of area, I, across the beam:

$$\tau_m(s,t)A(s) + \left[\int_s^L F_y(s,t)A(s)ds\right]\cos\theta - \left[\int_s^L F_x(s,t)A(s)ds\right]\sin\theta = \\ -EI(s)\frac{\partial^2 \theta}{\partial s^2}(s,t) \tag{*}$$

This equation can also be iteratively solved to produce a beam with non-uniform E.

3.3 Parameters for Each Showcase:

In the following the parameters are provided that were used for each showcase, i.e., the dimensions of the beams and the number of Fourier series coefficients, or n and m, respectively. These parameters are summarized in Table 1.

TABLE 1

Parameters for each showcase.

| | Cosine | Jellyfish-like robot | Undulating Swimmer | Cilium |
|---|---|---|---|---|
| Length (mm) | 7 | 7 | 10 | 10 |
| Width (mm) | 5 | 3 | 3 | 3 |
| Thickness (μm) | 80 | 80 | 240 | 80 |
| m | — | 10 | 1 | 10 |
| n | 200 | 10 | 70 | 20 |

The quantitative representation of each showcases' magnetization profile is shown in FIG. 11.

The invention claimed is:

1. A method of fabricating a shape-changeable magnetic member comprising a plurality of segments with each segment being able to be magnetized with a desired magnitude and orientation of magnetization, the method comprising the steps of:
    defining a first shape of the member;
    defining at least one second shape the member can adopt through an application of at least one magnetic field;
    determining a desired orientation and magnitude of magnetization for each of the plurality of segments, such that the member can at least approximately change its shape from the first shape to the at least one second shape through the application of the at least one magnetic field; and
    producing the member by forming each segment such that it at least substantially has the respective desired orientation and magnitude of magnetization when the member adopts the first shape in the absence of the at least one magnetic field.

2. The method in accordance with claim 1, wherein the step of producing the member includes the step of permanently magnetizing the shape-changeable magnetic member in a magnetic field sufficient to bring about a permanent magnetization.

3. The method in accordance with claim 2, wherein the step of permanently magnetizing the shape-changeable magnetic member is carried out using at least one jig having a pre-defined shape that subsequently defines the orientation of magnetization of the shape-changeable magnetic member.

4. The method in accordance with claim 1, wherein the desired orientation and magnitude of magnetization for at least one shape of the member is determined by determining a desired elastic deformation of the member at a spacing s along a length L from an end of the member having a plurality of segments of length ds, at a time t and at a point of deflection θ(s, t), the member having a constant cross-sectional area A, by solving the following iterative equation:

$$\tau_m + \int_s^L F_y ds \cos\theta - \int_s^L F_x ds \sin\theta = -\frac{EI}{A}\frac{\partial^2 \theta}{\partial s^2},$$

where E, and I represent Young's modulus and a second moment of area, respectively, where the applied magnetic torques and forces on the element are represented by $l_m(s, t)$, and $F_x(s, t)$ and $F_y(s, t)$, respectively, and where the directions of the magnetic forces is indicated by their subscript (x or y).

5. The method in accordance with claim 1, wherein the desired orientation and magnitude of magnetization for at least one shape of the member is determined by determining a desired elastic deformation of the member at a spacing s along a length L from an end of the member having a plurality of segments of length ds, at a time t and at a point of deflection θ(s, t), using the following iterative equation for the member having varying cross-sectional size A and/or varying moments of inertia I:

$$\tau_m(s, t)A(s) + \left[\int_s^L F_y(s, t)A(s)ds\right]\cos\theta - \left[\int_s^L F_x(s, t)A(s)ds\right]\sin\theta = -EI(s)\frac{\partial^2 \theta}{\partial s^2}(s, t)$$

where E, I, L, and A represent Young's modulus and a second moment of area, respectively, where the applied magnetic torques and forces on the element are represented by $l_m(s, t)$, and Fx(s, t) and Fy(s, t), respectively, and where the directions of the magnetic forces are indicated by their respective subscript (x or y).

6. The method in accordance with claim 1, wherein the step of producing the member includes the step of providing at least one mold into which a first mixture composed of at least an elastic material and a magnetizable material is introduced, with the shape of the mold defining the magnitude of the magnetization of the shape-changeable magnetic member or with the member being cut from a material formed in a mold to have a desired shape that can have the defined magnitude of the magnetization of the shape-changeable magnetic member or with a shape of the member being printed by use of a 3D printer.

7. The method in accordance with claim 1, wherein the shape-changeable magnetic member comprises at least two components selected from the group of components consisting of an elastic material, a magnetizable material, a filler material, a metallic filler material and combinations of the foregoing.

8. The method in accordance with claim 1, wherein the steps of defining the at least first and second shapes of the members is carried out to define a motion of the shape-changeable magnetic member when subjected, at least intermittently, to the at least one magnetic field.

* * * * *